US012658276B2

(12) United States Patent
Zlotnik et al.

(10) Patent No.: US 12,658,276 B2
(45) Date of Patent: Jun. 16, 2026

(54) VOLTAGE SCALING BASED ON ERROR RATE FLUCTUATIONS

(71) Applicant: Micron Technology, Inc., Boise, ID (US)

(72) Inventors: Leon Zlotnik, Camino, CA (US); Leonid Minz, Beer Sheva (IL)

(73) Assignee: Micron Technology, Inc., Boise, ID (US)

(*) Notice: Subject to any disclaimer, the term of this patent is extended or adjusted under 35 U.S.C. 154(b) by 162 days.

(21) Appl. No.: 18/774,638

(22) Filed: Jul. 16, 2024

(65) Prior Publication Data

US 2025/0069679 A1     Feb. 27, 2025

Related U.S. Application Data

(60) Provisional application No. 63/578,911, filed on Aug. 25, 2023.

(51) Int. Cl.
G11C 29/44      (2006.01)
G11C 7/04       (2006.01)
G11C 29/36      (2006.01)

(52) U.S. Cl.
CPC ................ G11C 29/44 (2013.01); G11C 7/04 (2013.01); G11C 29/36 (2013.01)

(58) Field of Classification Search
CPC .......... G11C 29/44; G11C 7/04; G11C 29/36; G11C 29/021; G11C 29/028; G11C 29/12; G11C 29/12005

USPC .......................................................... 365/201
See application file for complete search history.

(56) References Cited

U.S. PATENT DOCUMENTS

| | | | |
|---|---|---|---|
| 6,628,621 B1 * | 9/2003 | Appleton | ................ H04L 1/244 |
| | | | 379/27.04 |
| 9,786,356 B2 | 10/2017 | Wang et al. | |
| 2009/0016140 A1 | 1/2009 | Qureshi et al. | |
| 2020/0135293 A1 * | 4/2020 | Raychaudhuri | ....... G06F 11/106 |

FOREIGN PATENT DOCUMENTS

EP          3660628          12/2023

* cited by examiner

*Primary Examiner* — Huan Hoang
(74) *Attorney, Agent, or Firm* — Brooks, Cameron & Huebsch, PLLC

(57)          ABSTRACT

A method includes determining a target total bit-error-rate (BER), calculating a target channel BER based on the target total BER, and training a channel to the calculated target channel BER by transmitting data over the channel in a loop from a physical input/output (PHY I/O) to a memory device, transmitting the test data over the channel in the loop from the memory device to the PHY I/O, wherein the data is looped from the memory device and back to the PHY I/O without being written to or road from the memory device, determining an actual channel BER based on the data transmitted to and received from the memory device, comparing the actual channel BER to the calculated target channel BER, and regulating a voltage value based on the comparison.

20 Claims, 5 Drawing Sheets

471 — TRANSMIT TEST DATA TO A MEMORY DEVICE

473 — RECEIVE TEST DATA FROM THE MEMORY DEVICE

475 — DETERMINE AN ACTUAL BIT-ERROR-RATE (BER) ASSOCIATED WITH A CHANNEL

477 — DETERMINE A TEMPERATURE AND A VOLTAGE VALUE

479 — CONTROL REGULATION OF THE VOLTAGE VALUE

VOLTAGE SCALING BASED ON ERROR RATE FLUCTUATIONS

PRIORITY INFORMATION

This Application claims the benefit of U.S. Provisional Application No. 63/578,911, filed on Aug. 25, 2023, the contents of which are incorporated herein by reference.

TECHNICAL FIELD

Embodiments of the disclosure relate generally to memory sub-systems, and more specifically, relate to voltage scaling based on error rate fluctuations.

BACKGROUND

A memory system can comprise a memory sub-system that can include one or more memory devices that store data, a digital logic, and an associated voltage control. The memory devices can be, for example, non-volatile memory devices and volatile memory devices. In general, a host system can utilize a memory sub-system to store data at the memory devices and to retrieve data from the memory devices and the voltage control can change a voltage during operation of the digital logic.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
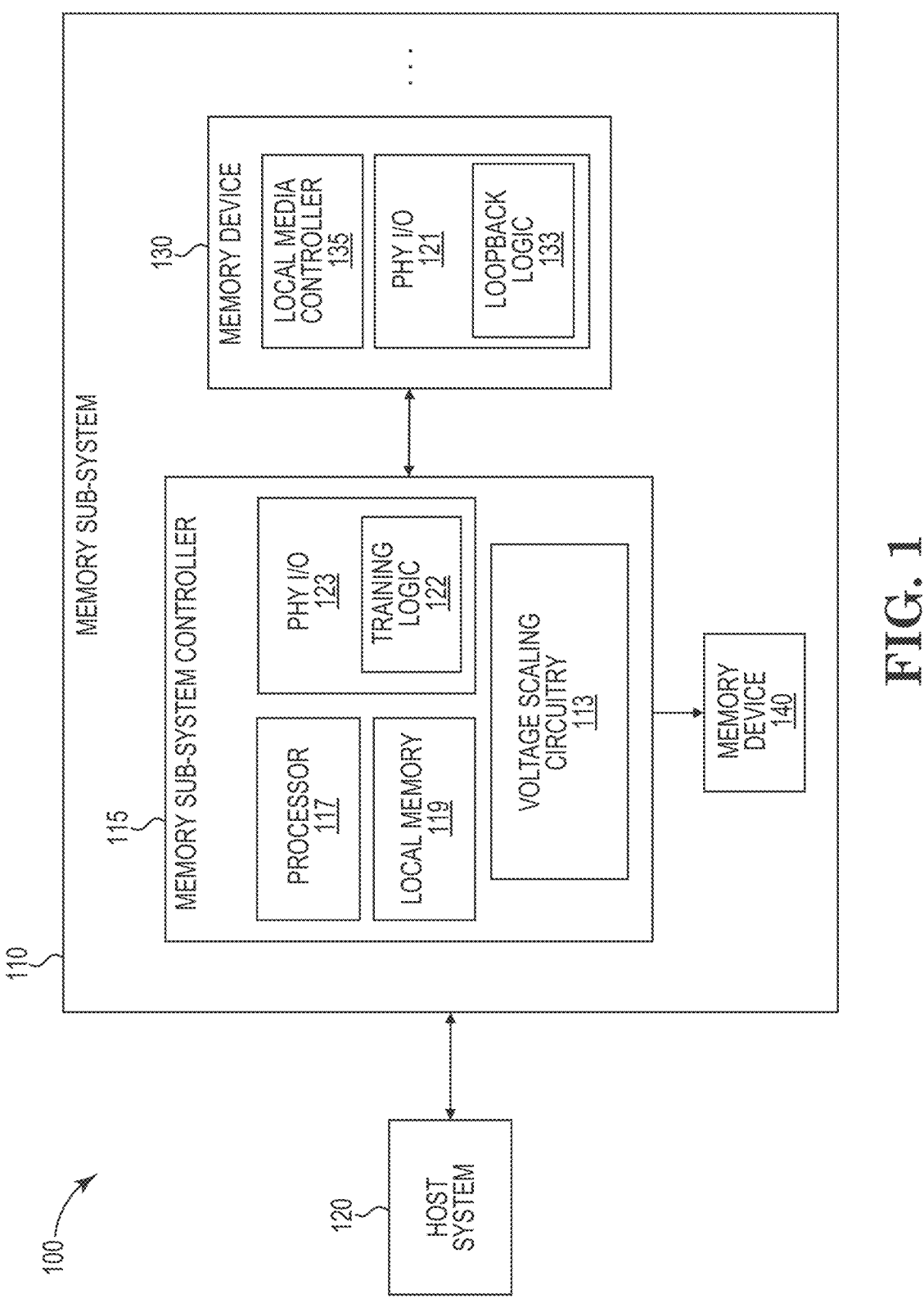
FIG. 1 illustrates an example computing system that includes a memory sub-system in accordance with some embodiments of the present disclosure.

Aspects of the present disclosure are directed to voltage scaling based on error rate fluctuations, in particular to memory sub-systems that include circuitry (e.g., voltage scaling circuitry) to perform voltage scaling based on the error rate fluctuations. Voltage scaling can be used to match system power consumption with desired performance. Error rates associated with a system (e.g., a computing system) can be monitored to determine a setting for a voltage value. Dynamic voltage adjustment is a technique that aims at reducing the power consumption of a system by dynamically adjusting the voltage of the system. This can exploit the fact that the system generally has a nominal voltage setting. Dynamic voltage scaling to increase voltage can be referred to as overvolting, whereas dynamic voltage scaling to decrease voltage can be referred to as undervolting. Undervolting can be performed in order to conserve power, particularly in computing systems such as laptops and other mobile devices, where energy comes from a battery and thus is limited, or, in some cases, to increase reliability of a computing system.

A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

During operation of a computing system, data can incur errors while being transferred to and/or from a device and/or as a result of inherent characteristics of the device. For example, a fiber optic receiver or a radio that delivers data to a controller may have a percentage of data transferred which has been corrupted. In one embodiment, a memory device that includes a memory sub-system may encounter data corruption to a percentage of data transferred to and from the memory device. Additionally, memory devices (i.e., such as NAND memory devices) may introduce errors (e.g., flipped bits) to data stored thereby due to inherent behaviors of the memory device, such as voltage drift, read/write disturbance, and/or memory cell degradation, among others. As a result, performance of a read operation may return bits from memory cells (e.g., NAND memory cells) that are different from bits written to the memory cells. For instance, a logical "0" written to a memory cell may be read as a logical "1," or vice versa. The rate of error exhibited by the memory device (e.g., bit-error-rate of the memory device and/or signal-to-noise ratio of the memory device) may fluctuate over time due to factors such as temperature, age of the memory device, utilization or workload of the memory device, etc.

For instance, because electrical current is utilized to provide power to the memory sub-system, the memory sub-system can exhibit temperature fluctuations during operation. Such fluctuations can become more pronounced based on the type of workload the memory sub-system is subject to. For example, some types of workloads that can be characterized by high volumes of operations can give rise to greater temperature fluctuations within the memory sub-system than workloads that are characterized by low volumes of operations, resulting in a higher memory device error rate. Further, a memory sub-system can experience temperature fluctuations based on the environment in which the memory sub-system is deployed. Additionally, over time and use, the quality of the memory sub-system can degrade yielding a higher error rate and a greater susceptibility to temperature and workload changes.

Additionally, as the memory sub-system interacts with the host system via a channel (or other interface, communication bus, etc.), errors can be encountered over the channel (e.g., bit-error-rate of the channel, a signal-to-noise ratio of the channel). Channel error can be dependent upon, but is not limited to, temperature of the memory sub-system and/or the environment, aging, voltage stabilities, and/or changes in frequency (e.g., speed). As a general rule, the faster the channel, the higher the bit-error-rate (BER), and accordingly, the slower the channel, the lower the BER. Additionally, tolerances within the system can affect channel error rate. For example, tolerances within on and off die terminations, I/O slope and driving strength of settings, internal PLL/DLL jitter requirements, internal analog and digital power supplies, as a non-limiting example, can affect the channel error rate. Therefore, the system may experience a total BER that is equal to a sum of a BER of the memory device (e.g., errors introduced during operation of the memory device) and a BER encountered via the channel (e.g., errors introduced as a result of the data traversing the channel). When the memory device BER is minimal, tolerances described above may be widened or voltage to the system may be reduced thereby intentionally permitting more errors to be encountered across the channel resulting in the need for less precision within components utilized in the system, a reduction in resources (e.g., a reduction in power consumptions), and/or a reduction in costs.

However, the memory device BER may, at times, be significant and therefore may require mitigation of the channel BER. The channel BER can be mitigated in several non-limiting ways (e.g., tighter tolerances of the system, manipulation of I/O slew rate, termination, internal bias, reducing speed, or adjusting driving strength, pull-up/pull-down, attenuation/gain, clocking frequency and/or rate, etc.) In some embodiments, the channel BER can be mitigated by operating the channel at or above a particular voltage value, which can be referred to as the "nominal voltage value" of the channel (or interface, bus, etc.). For example, the channel BER may change dependent upon a voltage value supplied to the system. For example, the greater the voltage supplied to the system (e.g., to the channel) the lower the channel BER. Given a sufficiently high voltage and therefore a low channel BER, some approaches may result in a total BER (the sum of the BER of the memory device and the channel) that is better than a target BER at which the system can sufficiently operate (e.g., store data or otherwise operate as designed). However, such approaches may incur reduced overall efficiency of the system, increased power consumption, and/or increased thermal load experienced by the memory sub-system or components thereof, as a result of operating better than the target total BER (e.g., at the relatively high voltage).

Aspects of the present disclosure address the above and other deficiencies by determining whether the system is operating above, below, or within a threshold amount of a target total BER and/or above, below, or within a threshold amount of a target channel BER. For example, embodiments herein can allow for dynamic control of the channel BER, to reduce power consumption within a memory sub-system without negatively impacting performance of memory devices, such as NAND memory devices, that are utilized by the memory sub-system.

For example, some embodiments herein transmit data to a PHY I/O (e.g., a physical input/output (PHY I/O)) of a memory device, write the data to the memory device, generate a bit string including the data read from the memory device, transmit the bit string to a PHY I/O of a device via the channel (e.g., such as an Open NAND Flash Interface (ONFI) channel), and determine an actual total BER.

Further, some embodiments herein include training logic utilized in transmitting to and receiving test data from the memory device via the channel in a loop without reading or writing the test data to the memory; determine an actual channel BER from the looped data; in response to the actual total BER being associated with the actual channel BER in a data structure within a threshold period of time, regulate a voltage value associated with the channel; or in response to the actual total BER not being associated with the actual channel BER in the data structure or not being associated in the data structure within the threshold period of time, calculate a difference between the actual total BER and the actual channel BER to determine an actual memory device BER, calculate a target channel BER based on a difference between a target total BER and the actual memory device BER, compare the actual channel BER to the calculated target channel BER, and based on the comparison, regulate a voltage value associated with the channel. The voltage value may thus be regulated to a level that increases efficiency of the system and yet continues to yield an acceptable actual total BER. That is, embodiments herein may regulate the voltage value to mitigate (e.g., decrease) a difference between the actual total BER and the target total BER and/or a difference between the actual channel BER and the calculated target channel BER thereby increasing the efficiency of the system. However, examples are not so limiting and tolerances of the system, manipulation of I/O slew rate, termination, internal bias, speed, driving strength, pull-up/pulldown, attenuation/gain, clocking frequency and/or rate may be manipulated and/or regulated to mitigate (or, in combination with voltage regulation, further mitigate) the difference between the actual total BER and the target total BER and/or the difference between the actual channel BER and the calculated target channel BER.

In some embodiments, a temperature associated with the channel can be monitored by a temperature sensor coupled to the channel (e.g., by circuitry associated with an ONFI interface). When the actual total BER mentioned above is less than or greater than the target total BER and/or the actual channel BER is less than or greater than the calculated target channel BER, an amount of power provided to various components of the memory sub-system can be regulated. Regulating the power can alter the actual channel BER, and in turn alter the actual total BER. In some embodiments, the efficiency of the system can be increased while still operating within the target total BER. Further, the channel temperature and the regulated voltage value can be associated with the actual total BER and/or the actual channel BER and can be stored in the data structure for future reference. For example, the data structure may be a database and/or a look-up table though examples are not so limited. Additionally, a current date and time can be associated with the channel temperature, the regulated voltage value, and the actual total BER and/or the actual channel BER and stored in the data structure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via the same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device. The memory sub-system 110 can also include voltage scaling circuitry 113. Although not shown in FIG. 1 so as to not obfuscate the drawings, the voltage scaling circuitry 113 can include various circuitry to facilitate regulating a voltage in response to a comparison between a target total BER and an actual total BER and/or between a comparison between a calculated target channel BER and an actual channel BER. For example, performance of a read operation of a memory device 130 may return bits from memory cells (e.g., NAND memory cells) that are different from bits written to the memory cells. For instance, a logical "0" written to a memory cell of the memory device 130 may be read as a logical "1," or vice versa. Additionally, the channel over which a bit string is transferred can cause errors during the transfer of data between the memory device PHY I/O 121 and a memory sub-system controller PHY I/O 123 or a host device. The actual total BER can, therefore, include the actual BER of the memory device 130 in addition to the actual BER of the channel. The actual total BER can be determined based on the data sent and written to and read and received from the memory device 130 and the actual channel BER can be determined based on test data sent to and received from the memory device 130 in a loop without being written to or read from the memory device 130. Further, the actual memory device BER can be calculated based on a difference between the actual total BER and the actual channel BER, as discussed further below. Further, as will be appreciated, the memory sub-system controller PHY I/O 123 and the memory device PHY I/O 121 can generally be input/output (I/O) devices of a physical (PHY) layer of the OSI of computing. In some embodiments, PHY I/O 121 and 123 can be an ONFI interface, although embodiments are not so limited.

Further, the memory sub-system 110 can include a training logic 122. Although not shown in FIG. 1 so as to not obfuscate the drawings, the training logic 122 can include various circuity to facilitate training the channel voltage based on the comparison between the target total BER and the actual total BER and/or between the comparison between the target channel BER and the actual channel BER and a temperature, voltage and other parameters associated with the channel, as described further herein.

In some embodiments, the voltage scaling circuitry 113 can include special purpose circuitry in the form of an ASIC, FPGA, state machine, and/or other logic circuitry that can allow the voltage scaling circuitry 113 to orchestrate and/or perform operations to selectively perform regulation of the voltage.

In some embodiments, the memory sub-system controller 115 includes at least a portion of the voltage scaling circuitry 113. For example, the memory sub-system controller 115 can include a processor 117 (processing device) configured to execute instructions stored in local memory 119 for performing the operations described herein. In some embodiments, the voltage scaling circuitry 113 is part of the host system 120, an application, or an operating system.

In a non-limiting example, an apparatus (e.g., the computing system 100) can include memory sub-system voltage scaling circuitry 113. The memory sub-system voltage scaling circuitry 113 can be resident on the memory sub-system 110. As used herein, the term "resident on" refers to something that is physically located on a particular component. For example, the memory sub-system voltage scaling circuitry 113 being "resident on" the memory sub-system 110 refers to a condition in which the hardware circuitry that comprises the memory sub-system voltage scaling circuitry 113 is physically located on the memory sub-system 110. The term "resident on" can be used interchangeably with other terms such as "deployed on" or "located on," herein.

The memory sub-system voltage scaling circuitry 113 can be configured to regulate and/or control regulation of voltage. Voltage may be regulated based on the actual total BER. For example, data can be sent to a PHY I/O 121 of the memory device 130 from a PHY I/O 123 of the memory sub-system controller 115 over a channel. A bit string including data read from the memory device 130 can be generated by the memory device 130. The bit string comprising the data read from the memory device 130 can be received by the memory sub-system controller PHY I/O 123 over the channel. The memory sub-system controller 115 can control transmission of the bit string, generated by memory device 130, to the PHY I/O 123 of the memory sub-system 110.

As will be further described herein, an actual total BER can be determined from the received bit string based on a number of errors corrected by a decoder (e.g., the decoder 225 illustrated in FIG. 2, herein) of the memory sub-system 110. In some embodiments, the memory sub-system voltage scaling circuitry 113 can regulate a voltage in response to a comparison between the actual total BER and a determined target total BER. For example, in a situation where the actual total BER is greater than the target total BER, increasing the voltage may decrease the actual channel BER and thereby decrease the actual total BER (e.g., as the actual total BER is equal to a sum of the channel BER and the memory device BER). Conversely, in a situation where the actual total BER is less than the target total BER, decreasing the voltage may increase the actual channel BER, in turn increasing the actual total BER. Further, in a situation where the actual total BER is at or equal to the target total BER (or within a threshold value of the target total BER), maintaining the voltage may maintain the actual channel BER and the actual total BER.

In some embodiments, the memory sub-system voltage scaling circuitry 113 can be configured to regulate and/or control regulation of voltage based on the actual channel BER. For example, the memory device 130 can include loopback logic 133. In some embodiments, the loopback logic 133 can be coupled to the memory device PHY I/O 121. The test data can be sent to the memory device 130 and received back from the memory device 130 in a loop. That is, the test data can be sent to and received from the memory device 130 without reading or writing the test data to the memory device 130. The actual channel BER can be determined based on a number of errors encountered by the looped test data as the looped test data traverses the channel. For example, utilizing the training logic 222, the test data sent to the memory device 130 can be compared to the test data received back from the memory device 130 in the loop. However, examples are not so limited and in some embodiments the actual channel BER can be determined based on the number of errors encountered while traversing the channel (e.g., that are corrected by a decoder (e.g., the decoder 225 illustrated in FIG. 2, herein) coupled to the processor 117 of the memory sub-system 110).

In some embodiments, the processor 117 coupled to the PHY I/O 123 of the memory sub-system controller 115 can be configured to calculate an actual BER for at least one of the memory components of the memory sub-system 110. The actual memory device BER can be based on a difference between the actual total BER and the actual channel BER. In some embodiments, the memory sub-system controller PHY I/O 123 (e.g., the processor 117 coupled to the PHY I/O 123) can be further configured to calculate a target channel BER based on a difference between the target total BER and the actual memory device BER. The actual channel BER may be compared to the calculated target channel BER to determine whether the actual channel BER is below, above, or at the calculated target channel BER. As such, a voltage may be regulated (i.e., altered to increase or decrease the voltage value) in response to the comparison between the actual channel BER and the calculated target channel BER, as is described further herein. Further, the actual channel BER can be associated with the actual total BER and/or the actual memory device BER and the calculated target channel BER and stored in a data structure. Additionally, a current date or current date and time that the actual total BER and the actual channel BER are determined may further be associated with the calculated target channel BER and stored in the data structure.

For example, in some embodiments, the memory sub-system controller PHY I/O 123 (e.g., the processor 117 coupled to the PHY I/O 123) can be configured to cause, based on determining that the actual channel BER is below a threshold value of the target channel BER, a voltage value to be scaled down. In some embodiments, the memory sub-system controller PHY I/O 123 (e.g., the processor 117 coupled to the PHY I/O 123) can be configured to cause, based on determining that the actual channel BER is above a threshold value of the target channel BER, a voltage value to be scaled up. In some embodiments, the memory sub-system controller PHY I/O 123 (e.g., the processor 117 coupled to the PHY I/O 123) can be configured to cause, based on determining that the actual channel BER is within a threshold value of the target channel BER, a voltage value to be maintained (i.e., remain unaltered).

By determining the comparison between the actual total BER and the target total BER and/or the actual channel BER and the calculated target channel BER and scaling the voltage supplied based on the comparison, the actual channel BER can be adjusted to result in an overall adjustment to the actual total BER (e.g., to maintain the actual total BER within a threshold amount of the target total BER). Adjusting the actual channel BER as described herein can allow the system to operate at an acceptable error rate (e.g., the target total BER) with minimal voltage supplied, increasing efficiency of the system and thereby providing an improvement to the overall function of computing systems in which aspects of the present disclosure are employed. Though examples of adjusting of the actual channel BER by scaling or regulating the voltage supplied are described herein, examples of adjusting the actual channel BER are not so limited and may include or further include altering other factors such as tightening tolerances of the system, manipulating of I/O slew rate, termination, internal bias, reducing of speed, or adjusting of driving strength, pull-up/pulldown, attenuation/gain, clocking frequency and/or rate, to name a few.

Figure 2:
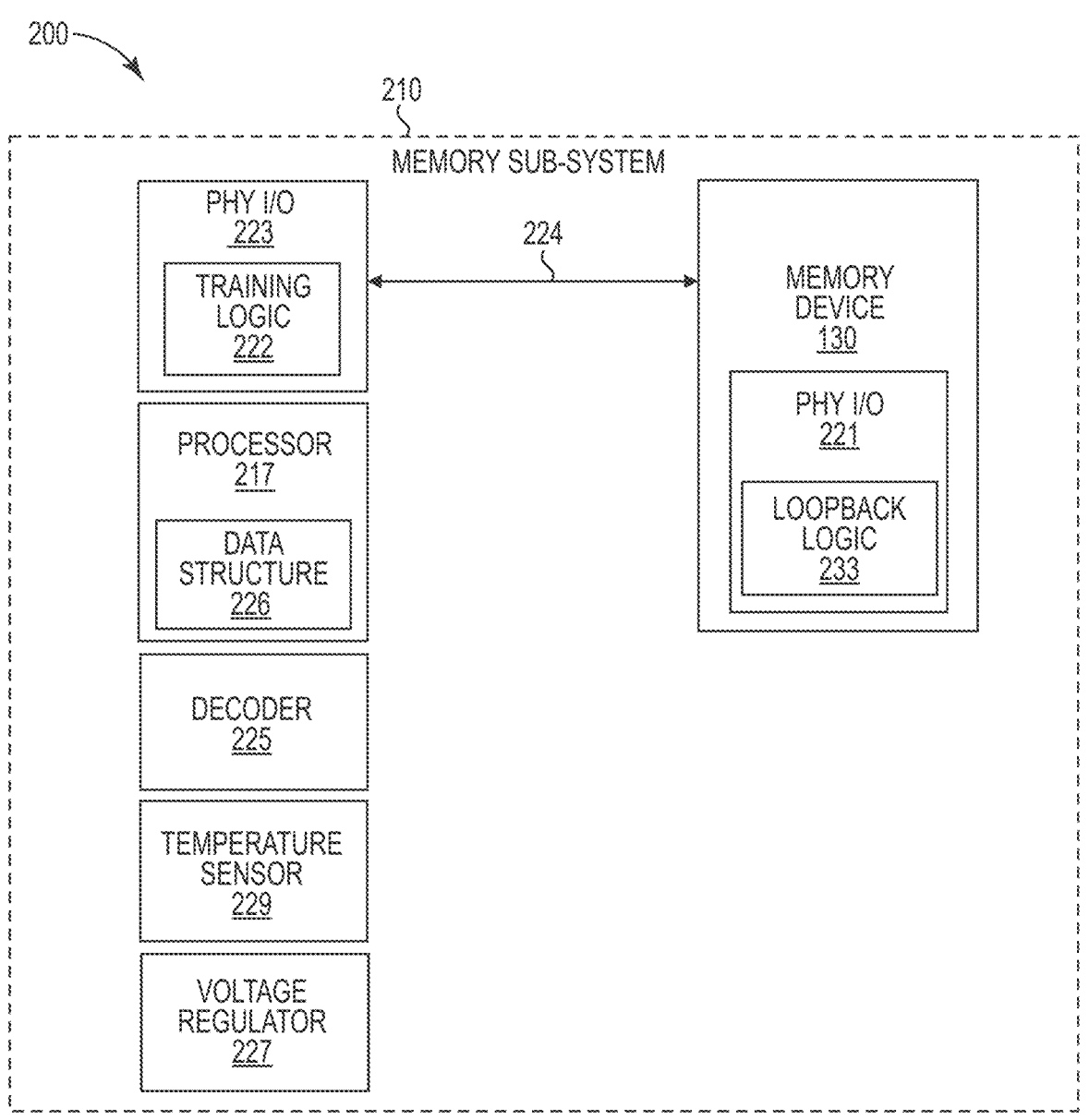
FIG. 2 illustrates an example apparatus for voltage scaling based on error rate fluctuations in accordance with some embodiments of the present disclosure.

FIG. 2 illustrates an example apparatus 200 for voltage scaling based on error rate fluctuations in accordance with some embodiments of the present disclosure. The apparatus can include a physical input/output (PHY I/O) 223. The PHY I/O 223 can include a training logic 222 and can be coupled to a processor 217, a decoder 225 (e.g., a low-density parity-check (LDPC) decoder), a temperature sensor 229, and/or a voltage regulator 227. The processor 217 can include a data structure 226 for storing data and retrieving stored data.

In some embodiments, an actual total BER of a memory sub-system 210 can be determined. For example, the PHY I/O 223 can send data information to a PHY I/O 221 of a memory device 130 for the memory sub-system 210 of the apparatus 200. The sent data may be written to the memory device 130. The memory device 130, in turn, can send data information read from the memory device 130 from the PHY I/O 221 of the memory device 130 to the PHY I/O 223. The data information may be included in a bit string and in some embodiments, the processor 217 coupled to the PHY I/O 223 can receive the bit string including the data information. For example, the PHY I/O 223 may be coupled to the PHY I/O 221 of the memory device 130 via a channel 224. As such, the PHY I/O 223 can receive the bit string from the memory device 130 via the channel 224. In not so limiting examples, the bit string can be received via a channel that is associated with an Open NAND Flash Interface (ONFI) interface, a bus, or similar collection of channels configured to facilitate transfer of data, such as bit strings between the PHY I/O 223 and the memory device 130.

The bit string can include a codeword. The codeword can include host data (e.g., user data, etc.) and/or an element of an error-correcting code. In general, a "codeword" refers to a bit string that contains a predetermined quantity of bits that may include data (e.g., a payload), error correction bits (e.g., parity), a header (e.g., one or more bits describing the purpose of the bit string), and/or an address locator (e.g., an address from which or to which the bit string is to be written or to be retrieved).

The processor 217, utilizing the decoder 225, can be configured to determine the actual total BER based on the data sent from the PHY I/O 223 and written to the memory device 130 and data read from and received by the PHY I/O 223 from the memory device 130. The received data information can be different than the sent data information due to errors in the memory device 130 and errors encountered when transmitting and receiving data over the channel 224. For example, the decoder 225 can be coupled to the PHY I/O 223 and/or the memory device 130. The decoder 225 can be a Low-Density Parity-Check (LDPC) decoder 225, which can include firmware and/or hardware, configured to decode the codeword. Decoding the codeword can be part of a read operation. Decoded data, yielded from decoding the codeword, can be used to determine a total number of actual errors received from the memory device 130 and encountered over the channel 224. For example, performance of the read operation may return bits from memory cells (e.g., NAND memory cells) that are different from bits written to the memory cells. For instance, a logical "0" written to a memory cell may be read as a logical "1," or vice versa. Additionally, the channel 224 over which the bit string is transferred can cause errors during the transfer of data between the PHY I/O 221 of the memory device 130 and the PHY I/O 223. The actual total BER can, therefore, include the actual BER of the memory device 130 in addition to the actual BER of the channel 224.

In some embodiments, a training logic 222 can be utilized in determining the actual channel BER. For example, a training logic 222 may be coupled to the PHY I/O 223 and the memory device 130 may include a loopback logic 233 coupled to the memory device PHY I/O 221. Test data information (e.g., test data used in training the channel) can be sent, utilizing the training logic 222, from the PHY I/O 223 to the PHY I/O 221 of the memory device 130 and received back, utilizing the loopback logic 233, from the PHY I/O 221 of the memory device 130 to the PHY I/O 223 without being written to or read from the memory device 130 (e.g., test data can be sent in a loop). In some embodiments, the processor 217 coupled to the PHY I/O 223 can send and receive the data information via the channel 224 (e.g., received via a channel 224 that is associated with an Open NAND Flash Interface (ONFI) interface, a bus, or similar collection of channels configured to facilitate transfer of data). The training logic 222 can be utilized to compare the test data sent to the test data received to determine the actual channel BER based on a quantity of errors encountered by the test data as the test data traverses the channel 224.

Accordingly, the decoder 225 coupled to the PHY I/O 223 and the processor 217 can be utilized to determine the actual total BER based on the data sent and written to the memory device 130 and read and received from the memory device 130. Further, utilizing the training logic 222 coupled to the PHY I/O 223 and the processor 217 and the loopback logic 233 coupled to the PHY I/O 221 of the memory device 130 the actual channel BER can be determined based on the test data looped to the memory device 130 without being written to or read from the memory device 130. The PHY I/O 223 (e.g., a processor 217 coupled to the PHY I/O 223) can further be utilized to calculate the actual memory device BER based on a difference between the actual total BER and the actual channel BER.

In some embodiments, the PHY I/O 223 (e.g., a processor 217 coupled to the PHY I/O 223) can thus control regulation of a voltage value based on the actual total BER and/or the actual channel BER. For example, the voltage value may be regulated based on a comparison between a target total BER and the actual total BER. The voltage value may be associated to the channel 224, thus regulating the voltage value can change (e.g., increase or decrease) the actual BER of the channel 224, in turn altering the actual total BER since the actual total BER is comprised of a sum of the actual channel BER and the actual memory device BER.

Further, the voltage value may be regulated based on a comparison between a calculated target channel BER (e.g., difference between the target total BER and an actual memory device BER) and the actual channel BER. In some embodiments, the actual total BER and the actual channel BER may be associated to the target channel BER and stored in a data structure and therefore the voltage value may be regulated based on a comparison between the actual channel BER and the target channel BER (associated with the actual total BER and the actual channel BER) stored in the data structure. Further, a date or a date and time that the actual total BER and the actual channel BER were determined may be associated to the target channel BER and stored in the data structure. The voltage value may be regulated based on the date or date and time that the actual total BER and the actual channel BER were stored in the data structure not exceeding a threshold period of time (e.g., 1 week, 1 month, 3 months, 6 months, etc.).

As previously stated, the voltage value may be associated to the channel 224, thus regulating the voltage value can change (e.g., increase or decrease) the actual BER of the channel 224. As will be further detailed herein, regulating the voltage value by looping test data between the PHY I/O 223 and the PHY I/O 221 of the memory device 130 and then comparing the calculated target channel BER to the actual channel BER may be known as training the channel to the calculated target channel BER. The training logic 222 coupled to the PHY I/O 223 and utilizing the processor 217 can include various circuity to facilitate training the channel voltage to the calculated target channel BER.

For example, the processor 217 can be configured to calculate the target channel BER based on a difference between the target total BER and the actual memory device BER. As such, because of fluctuations in the error rate of the memory device 130, the calculated target channel BER can be dynamic (e.g., can occur during normal operation of the memory device). For example, when the actual BER of the memory device 130 is nearly error free (i.e., a low error rate), the difference between the target total BER and the actual memory device BER may be close to the value of the target total BER. Therefore, the voltage value can be decreased, allowing a higher error rate across the channel 224. However, as the memory device 130 degrades over time, the actual error rate of the memory device 130 can increase. As such, when the actual BER of the memory device 130 increases closer to the target total BER (i.e., toward a high error rate), the difference between the target total BER and the actual memory device BER may reduce, reducing the calculated target channel BER. As such, the voltage value may be increased to minimize the actual BER encountered over the channel 224. In this way, the actual total BER can be maintained at or near the target total BER and the actual channel BER can be maintained at or near the dynamic calculated target channel BER.

Put another way, the BER of the memory device 130 can fluctuate over the life of the memory device 130 due to various circumstances such as fluctuations in temperatures, types of workloads, and derogation of the quality of the memory sub-system, though examples are not so limited. As such, the actual total BER (e.g., the actual BER of the channel 224 combined with the actual BER of the memory device 130) will fluctuate due to the changing quantity of errors exhibited from the memory device 130 throughout the life and operation of the memory device 130. As such, the difference between the target total BER and the actual memory device BER will change depending on various aspects of operation within the memory sub-system 210. To accommodate these changes so as to maintain an optimal efficiency and yield an acceptable actual total BER, the processor 217 can be configured to determine changes in the calculated target channel BER (e.g., acceptable BER of the channel 224) by retraining the channel, as described further herein. As such, changes in the calculated target channel BER may result from a change in the actual total BER caused by fluctuations in the memory device BER. In this way, the calculated target channel BER can be a roaming or dynamic value.

In some embodiments, the PHY I/O 223 may be further coupled to the voltage regulator 227. The processor 217 can be configured to control regulation of the voltage value, utilizing the voltage regulator 227, by altering a voltage value from a first voltage value to a second voltage value in response to a comparison between the actual total BER and the target total BER and/or between the actual channel BER and the calculated target channel BER. As stated above, as the memory device BER fluctuates over time and operation, the calculated target channel BER may change. As a result, the processor 217 can be configured to further control the voltage value in response to a comparison between the actual channel BER and the dynamic target channel BER. Put another way, the voltage value can depend on the actual total BER and can be regulated as the actual total BER fluctuates in order to target an optimal BER of the channel 224. Regulating the voltage value can mitigate or reduce a difference between the actual total BER and the target total BER and/or between the actual channel BER and the calculated target channel BER. Further, the voltage value can depend on the actual channel BER and can be regulated as the actual total BER fluctuates in order to target an optimal BER of the channel 224. Regulating the voltage value can mitigate or reduce a difference between the actual channel BER and the calculated target channel BER and, as will be described in further detail below, may further be regulated based on training and/or retraining of the channel 224 to the calculated target channel BER.

For example, in embodiments in which the channel 224 is provided as part of an ONFI bus (e.g., interface), the ONFI bus may operate at a nominal voltage value associated with the ONFI bus. This nominal voltage value may yield a minimal channel BER, however, as discussed herein, the nominal voltage value may be greater than necessary to operate the memory sub-system 210 while maintaining an actual total BER that is within acceptable error thresholds or error threshold ranges. In the situation where the actual channel BER is below the calculated target channel BER (and the actual total BER is below the target total BER, accordingly), the system is operating at a higher or "better" than required state than is required to maintain an acceptable total BER (e.g., target total BER). Reducing the voltage value can cause the actual channel BER to increase. However, in this example, an increase in the actual channel BER is acceptable since the actual channel BER is below the calculated target channel BER and thus the actual total BER is below the target total BER. The voltage value can be reduced, thereby reducing power consumption and adverse thermal effects on the memory sub-system 210 while increasing efficiency of the memory sub-system 210.

For example, the first voltage value can be the nominal voltage value associated with the ONFI bus and the second voltage value can be less than the first voltage value. In the situation where the actual channel BER is below a lower value of a threshold range of the calculated target channel BER, the processor 217 can be configured to cause the voltage regulator 227 to adjust the voltage value from the first voltage value (nominal ONFI bus voltage value) to the second voltage value (less than the nominal voltage value). In the situation where the actual channel BER is still below the lower value of the threshold range of the calculated target channel BER after the voltage value has been adjusted from the first voltage value to the second voltage value, the processor 217 can be configured to cause the voltage regulator 227 to regulate the voltage value by altering the voltage value from the second voltage value to a third voltage value, the third voltage value being less than the first voltage value and less than the second voltage value. As such, the voltage value can be regulated to reduce the difference between the actual total BER and the target total BER and/or between the actual channel BER and the calculated target channel BER.

Although three voltage values are described, the scope of the disclosure further contemplates the usage of greater than three voltage values to provide additional fine tuning to the voltage value that is selected during operation of the memory sub-system 210. Further, it is contemplated within the scope of the disclosure that, based on the actual channel BER, the voltage value can be dynamically altered. In the situation where the actual channel BER is higher than an upper value of the threshold range of the calculated target channel BER, the processor 217 can be configured to cause the voltage regulator 227 to adjust the voltage value. For example, increasing the voltage value from the third voltage value to the second voltage value, increasing the voltage value from the second voltage value to the nominal voltage value, and so on and so forth, reducing the difference between the actual total BER and the target total BER and/or between the actual channel BER and the calculated target channel BER.

In the situation where the actual channel BER is equal to or within the threshold range of the calculated target channel BER (and the actual total BER is equal to or within the threshold range of the target total BER, accordingly), the processor 217 can be configured to cause the voltage regulator 227 to maintain the voltage value.

The PHY I/O 223 may be further coupled to the temperature sensor 229. The processor 217 can be configured to monitor a temperature detected by the temperature sensor 229 and associated with the memory sub-system 210. As previously described above, the memory sub-system 210 can exhibit temperature fluctuations during operation. Such fluctuations can become more pronounced based on the type of workload the memory sub-system 210 is subject to. For example, high volumes of operations can give rise to greater temperature fluctuations than workloads with low volumes of operations, resulting in a higher memory device BER. Further, the memory sub-system 210 can experience temperature fluctuations based on the environment in which the memory sub-system 210 is deployed. Additionally, over time and use, the quality of the memory sub-system 210 can derogate yielding a higher error rate and a greater susceptibility to temperature and workload changes. The temperature can be monitored by the temperature sensor 229 to detect such temperature fluctuations.

As such, the actual total BER associated with the channel 224 fluctuates as the temperature associated with the memory sub-system 210 fluctuates. In the situation where the temperature increases, a different BER may be encountered while transferring data across the channel 224. For example, an increase in temperature a specific amount (e.g., 5 degrees, 10 degrees, 15 degrees, etc.) may increase the actual BER of the channel 224 sufficiently enough to result in the actual channel BER exceeding the upper value of the threshold range of the calculated target channel BER. Accordingly, the processor 217 can be configured to cause the voltage regulator 227 to increase the voltage value, reducing the channel BER. In the situation where the temperature decreases, a different BER may be encountered while transferring data across the channel 224. For example, a decrease in temperature a specific amount (e.g., 5 degrees, 10 degrees, 15 degrees, etc.) may decrease the actual BER of the channel 224 sufficiently enough to result in the actual channel BER dropping below the lower value of the threshold range of the calculated target channel BER. Accordingly, the processor 217 can be configured to cause the voltage regulator 227 to decrease the voltage value, increasing the actual channel BER. Additionally, the actual total BER associated with the memory device 130 fluctuates as the temperature associated with the memory sub-system 210 fluctuates. In the situation where the temperature increases or decreases a specific amount (e.g., 5 degrees, 10 degrees, 15 degrees, etc.) the actual memory device BER may fluctuate sufficiently enough to alter the actual total BER and the calculation between the target total BER and the actual memory device BER resulting in a variation of the calculated target channel BER.

As such, the processor 217 can be configured to train and/or retrain the channel 224 to cause the voltage regulator 227 to increase or decrease the voltage value, based on the fluctuation in the temperature. For example, in response to the temperature increasing or decreasing a specific amount (e.g., 5 degrees, 10 degrees, 15 degrees, etc.), the processor 217 can be configured to cause test data to be sent from the PHY I/O 223 to the PHY I/O 221 of the memory device 130 and loop back to the PHY I/O 223 from the PHY I/O 221 of the memory device 130. Utilizing the training logic 222, the processor 217 can further be configured to determine a difference (e.g., the errors encountered) between the data sent from the PHY I/O 223 to the PHY I/O 221 of the memory device 130 and the data received from the PHY I/O 221 of the memory device 130 to the PHY I/O 223. Since the data travels between the PHY I/O 223 and the PHY I/O 221 of the memory device 130 twice, once from the PHY I/O 223 to the PHY I/O 221 of the memory device 130 and once from the PHY I/O 221 of the memory device 130 to the PHY I/O 223, the actual BER determined by the processor 217 can be divided in half to determine the actual channel BER (e.g., error rate encountered over the channel 224).

Training the channel 224 to the calculated target channel BER can supply a voltage value that maintains the actual channel BER within the threshold range of the calculated target channel BER. Training the channel 224 to the calculated target channel BER can minimize instances where the actual total BER of the memory sub-system 210 exceeds the target total BER. In some embodiments, the PHY I/O 223 (e.g., a processor 217 coupled to the PHY I/O 223) may be configured to determine the temperature and the voltage value associated with the channel 224 and associate the temperature and the voltage value with the actual channel BER. The PHY I/O 223 (e.g., a processor 217 coupled to the PHY I/O 223) may be further configured to store the temperature, actual channel BER, and the voltage value. The processor 217 may store the temperature, actual channel BER, and the voltage value in a data structure 226. The processor 217 may further be configured to store the date and time the training or retraining of the channel was performed and, as is further described herein, may associate the date and time with the temperature, actual channel BER, and/or the voltage value.

As such, in the situation where the temperature detected by the temperature sensor 229 and monitored by the processor 217 fluctuates a specific amount (e.g., 5 degrees, 10 degrees, 15 degrees, etc.) the processor 217 may be configured to query the data structure 226. For example, the change in the temperature may significantly alter the actual channel BER and/or the actual memory device BER enough to cause the actual channel BER to be outside of the threshold range of the calculated target channel BER and/or to cause the actual total BER to be outside of the threshold range of the target total BER. As such, the processor 217, in response to the significant change in the temperature (e.g., 5 degrees, 10 degrees, 15 degrees, etc.) determined based on utilizing the temperature sensor 229, may be configured to determine a temperature associated with the channel 224. The processor 217 may be further configured to compare the temperature associated with the channel 224 to temperatures stored in the data structure 226.

In response to the temperature associated with the channel 224 not matching a temperature stored in the data structure 226, the processor 217 may be configured to retrain the channel 224 to the calculated target channel BER. For example, the PHY I/O 223 may send data to the PHY I/O 221 of the memory device 130 over the channel 224 and receive the data back from PHY I/O 221 of the memory device 130 without writing the data to or reading the data from the memory device 130. The data may be test data sent in a loop between the PHY I/O 223 coupled to the training logic 222 and the PHY I/O 221 coupled to the loopback logic 233 of the memory device 130. The processor 217 associated with the PHY I/O 223 may determine the actual channel BER based on a errors encountered by the test data as the test data traverses the channel and in response, the processor 217 may control regulation of the voltage value associated with the channel 224, as described previously. The processor 217 may be further configured to determine the voltage value associated with the channel 224, associate the temperature and the regulated voltage value with the actual channel BER, and store the temperature, actual channel BER, and the voltage value in the data structure 226. The processor 217 may be further configured to associate and store a current date or a current date and time with the temperature, actual channel BER, and the voltage value.

In response to the temperature associated with the channel 224 matching a temperature stored in the data structure 226, the processor 217 may be configured to determine a date or a date and time that the temperature was stored. For example, the processor 217 may be configured to associate and store a date or date and time the training or retraining was performed along with the temperature, actual channel BER, and the voltage value, in the data structure 226. In response to the date or date and time that the training or retraining was completed/stored exceeding a threshold period of time (e.g., 1 week, 1 month, 3 months, 6 months, etc.), the processor 217 may be further configured to retrain the channel 224. As such, the processor 217 may be configured to retrain the channel 224 due to changes in temperature and potential degradation of the memory subsystem 210 over time.

In response to the temperature associated with the channel 224 matching a temperature stored in the data structure 226 and the date or date and time the temperature was stored (e.g., the training or retraining of the channel 224 was performed) not exceeding the threshold period of time (e.g., 1 week, 1 month, 3 months, 6 months, etc.), the processor 217 may be further configured to regulate the voltage value based on the voltage value associated to the temperature, actual channel BER, and the date or date and time in the data structure 226. In this way, retraining is not completed and the voltage value can be regulated based on previously stored training data resulting in a more time efficient regulation of the voltage value.

In an illustrative non-limiting example, the memory subsystem 210 may be capable of regulating a PHY I/O voltage value. For example, a system may be booted. When the system boots the processor 217 of the PHY I/O 223 may be configured to train the channel 224 for a calculated target channel BER associated with a target total BER utilizing the training logic 222. For example, the target total BER may be about 2E-4 ($2\times10^{-4}$). A BER of 2E-4 ($2\times10^{-4}$) is similar to about 8 errors in one codeword of about 40K bits and thus can be detectable. A target total BER of 2E-4 ($2\times10^{-4}$), versus a smaller BER of 1E-6 ($1\times10^{-6}$), can save power and improve the efficiency of the memory sub-system 210 without negatively impacting performance of the memory device 130 (e.g., NAND memory device). This is because the memory device 130 may introduce an amount of errors that is below a threshold error rate (e.g., the memory device 130 is generally providing data that has a minimized quantity of errors associated therewith) and therefore the introduction of some additional errors by the channel 224 is acceptable, particularly due to the benefit of reduced power consumption, higher or "better" thermal performance, etc. that can be experienced by the memory sub-system 210 as a result of reduction in voltage value applied to the PHY I/O 223. Continuing with this example, the processor 217, utilizing the training logic 222, can be configured to record/store the training including the voltage value, temperature, and date and time at which the training was conducted. The temperature sensor 229 can detect the temperature and the processor 217 can monitor the detected temperature for a specific amount of change (e.g., 5 degrees, 10 degrees, 15 degrees, etc.). Although 5 degrees, 10 degrees, 15 degrees, etc., are mentioned herein, examples are not so limited and the processor 217 may be configured to monitor for any temperature value change or for a range of change.

When the monitored temperature changes beyond the specific amount (e.g., 5 degrees, 10 degrees, 15 degrees, etc.), the processor 217 can query the data structure 226 for the new temperature and training parameters associated with the new temperature. If the training and voltage value data are not already stored in the data structure 226, the processor 217 can be configured to record/store the training and voltage value and use the training and voltage value to tune the voltage regulator 227. If the training and voltage data were previously stored in the data structure 226, but the data was stored beyond the threshold period of time (e.g., 1 week, 1 month, 3 months, 6 months, etc.), the processor 217 can be configured to rewrite the updated data to the data structure 226. If the training and voltage data were previously stored in the data structure 226 within the threshold period of time (e.g., 1 week, 1 month, 3 months, 6 months, etc.), the processor 217 can be configured to load existing training parameters and voltage value into the PHY I/O 223 and the voltage regulator 227, respectively. Thus, the processor 217 and the voltage regulator 227, can maintain the target total BER of approximately 2E-4 ($2\times10^{-4}$) for a range of temperatures. Although 1 week, 1 month, 3 months, 6 months, etc. are mentioned herein, examples are not so limited and the processor 217 may be configured to monitor for any date or date range. Additionally, although a target total BER of approximately 2E-4 ($2\times10^{-4}$) is mentioned herein, examples of a target total BER are not so limited.

Figure 3:
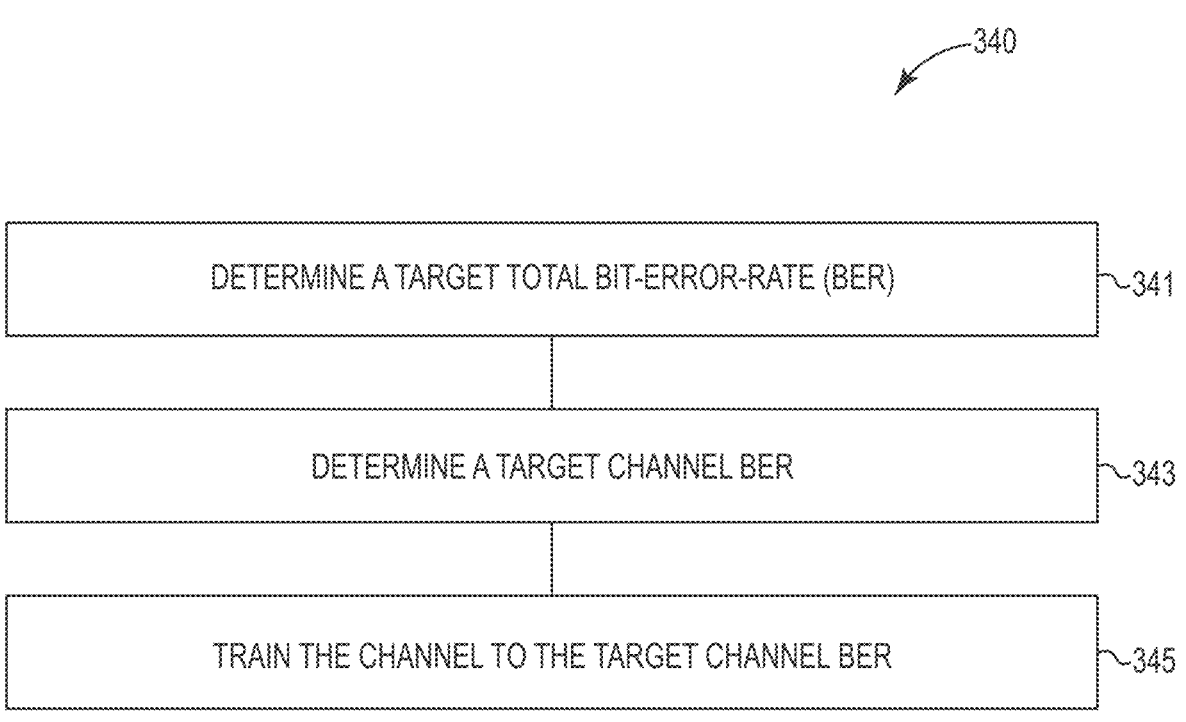
FIG. 3 illustrates an example method diagram for voltage scaling based on error rate fluctuations in accordance with some embodiments of the present disclosure.

FIG. 3 illustrates an example method 340 for voltage scaling based on error rate fluctuations in accordance with some embodiments of the present disclosure. The method 340 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 340 is performed by the memory sub-system circuitry 210 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 341, a target total BER can be determined. The target total BER can be the BER in which the greatest power saving and efficiency can be experienced without exceeding an acceptable actual total error rate of the memory sub-system. The processor 217 of FIG. 2 can be configured to determine the target total BER. For example, the target total BER of the memory sub-system, can be 2E-4 or $2\times10^{-4}$, though examples are not so limited.

At operation 343, a calculated target channel BER can be determined. The calculated target channel BER may be determined based on a difference between the target total BER (e.g., 2E-4 or $2\times10^{-4}$ in some examples) and an actual memory device BER. The actual memory device BER can be determined based on a difference between the actual total BER and an actual channel BER, as will be further described.

For example, in some embodiments, the actual total BER can be determined by transferring data over a channel (e.g., the channel 224 of FIG. 2) from the PHY I/O 223 of FIG. 2 to the memory device 130 of FIG. 2 (e.g., to the PHY I/O 221 of the memory device 130 of FIG. 2) and writing the data to the memory device. A bit string may be generated comprising the data read from the memory device and the bit string may be transmitted back over the channel from the memory device to the PHY I/O. In some embodiments, the data read from the memory device can comprise a codeword. Further, the data read from the memory device can comprise multiple codewords (e.g., 5, 10, etc.). The codeword(s) may be decoded utilizing the decoder 225 of FIG. 2 to determine an actual total BER based on errors in the data read and received from the memory device and corrected by the decoder. The actual total BER can include any errors in the data caused by the memory device and encountered over the channel.

In some embodiments, the actual channel BER can be determined by transferring test data over the channel from the PHY I/O utilizing training logic circuitry (e.g., the training logic 222 of FIG. 2) coupled to the PHY I/O to the memory device (e.g., to a PHY I/O of the memory device) and back from the memory device to the PHY I/O. For example, the memory device may include loopback logic (e.g., the loopback logic 233 of FIG. 2). The loopback logic may include circuitry that causes the test data received by the memory device to be looped back to the PHY I/O without being written to or read from the memory device. As such, the test data traverses the channel once from the PHY I/O to the memory device and again from the memory device to the PHY I/O. Accordingly, the test data can encounter errors while traversing the channel. The training logic may be utilized in determining the actual channel BER based on a number of errors in the looped test data encountered over traversing the channel. In some embodiments, since the test data traverses the channel twice, once to the memory device and once from the memory device, the number of errors may be divided in two to determine the actual channel BER.

The actual channel BER and the actual total BER may be queried in a data structure to determine a target channel BER. For example, the actual channel BER and the actual total BER may be previously stored in the data structure and associated with a target channel BER. In an example where the actual channel BER and the actual total BER are not associated with a target channel BER and stored in the data structure, or a time period of which the actual channel BER and the actual total BER were stored in the data structure exceeds a threshold period of time, the actual channel BER can be used with the actual total BER to calculate an actual BER of the memory device. Put another way, the actual memory device BER can be calculated from the difference between the actual total BER (determined from data send and written to the memory device and read and received from the memory device) and the actual channel BER (determined from test data looped between the PHY I/O and the memory device without being written to or read from the memory device). The actual BER of the memory device can be used with the target total BER to calculate the target channel BER. As such, the calculated target channel BER can be calculated from the difference between the target total BER and the actual memory device BER. The calculated target channel BER can be associated with the actual total BER, the actual channel BER, and a current date or current date and time and stored in the data structure for future use. As such, in some embodiments, since the target channel BER may be stored in the data structure the future voltage regulation can be performed without recalculating of the actual memory device BER and target channel BER, minimizing the workload of the system 410, saving time, and increasing efficiency.

At operation 345, the channel can be trained to the calculated target channel BER. For example, utilizing training logic, data may be transferred over the channel from the PHY I/O to the memory device and, utilizing loopback logic, received back by the PHY I/O from the memory device. As previously described, the data may be test data sent in a loop between the PHY I/O and the memory device. For example, the test data may not be written to or read from the memory device. In this way, the test data can be utilized to calculate an actual channel BER. The actual channel BER can be compared to the calculated target channel BER. In some embodiments, a voltage value associated with the channel can be regulated by varying a voltage value associated with a voltage regulator (e.g., the voltage regulator 227 of FIG. 2), based on the comparison between the actual channel BER and the calculated target channel BER.

Further, the temperature associated with the channel can be detected by a temperature sensor such as the temperature sensor 229 of FIG. 2. The temperature and voltage value associated with the channel can be determined and the channel temperature and the channel voltage value can be associated with the actual channel BER. The actual channel BER and the channel temperature and channel voltage value associated with the actual channel BER can be stored in the data structure 226 of FIG. 2 of the processor coupled to the PHY I/O.

As previously described, fluctuations in temperature can cause fluctuations in BER encountered by the memory sub-system. For example, the channel BER may increase or decrease based on a change in temperature. In some embodiments, the temperature associated with the channel can be monitored and in response to a change in the monitored temperature value exceeding a threshold value, the data structure can be queried for information associated with the monitored temperature value. In response to the information associated with the monitored temperature value not being in the data structure, the channel may be retrained to the calculated target channel BER. Additionally, in response to the information associated with the monitored temperature value being in the data structure, the date or date and time that the information was stored in the data structure may be determined. In response to the date or date and time that the information was stored exceeding a threshold period of time, the channel may be retrained to the calculated target channel BER.

Figure 4:
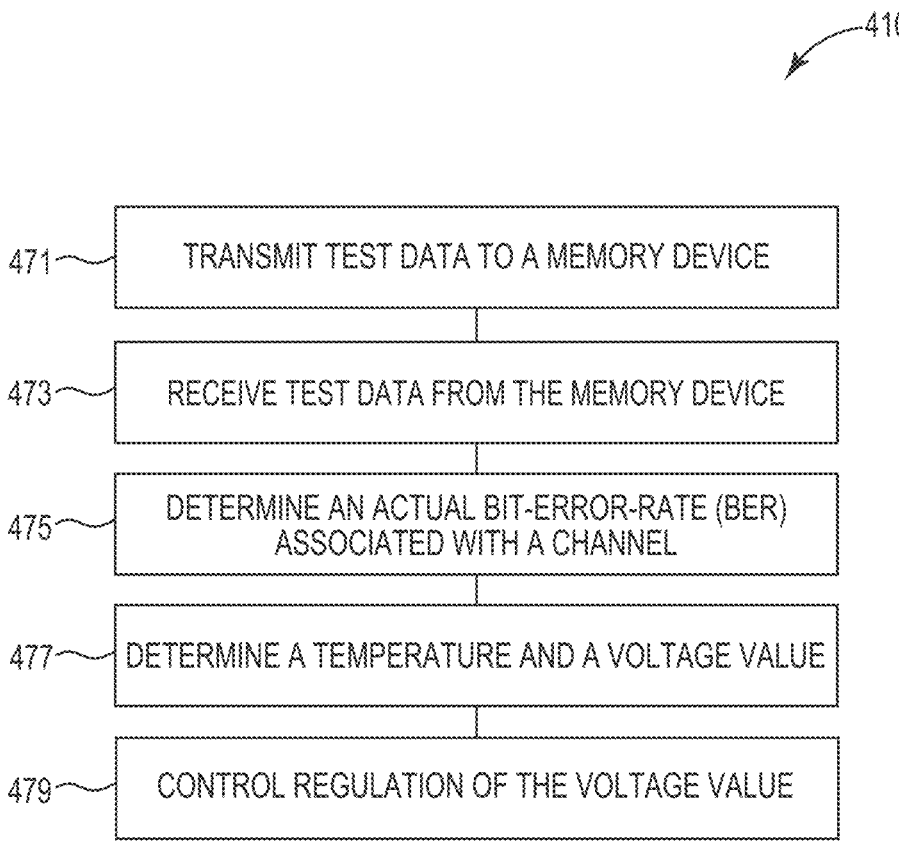
FIG. 4 illustrates an example system that includes a memory device and a PHY I/O in accordance with some embodiments of the present disclosure.

FIG. 4 illustrates an example system 410 that includes a memory device (e.g., the memory device 130 of FIG. 2) and a PHY I/O (e.g., the PHY I/O 223 of FIG. 2) in accordance with some embodiments of the present disclosure. The memory device (e.g., the PHY I/O 221 of the memory device 130 of FIG. 2) can be coupled to the PHY I/O and a processor (e.g., the processor 221 of FIG. 2) via a channel (e.g., the channel 224 of FIG. 2).

At operation 471 of the system 410, the PHY I/O can be configured to transmit data to the memory device. The PHY I/O can transmit the data to the memory device via the channel. The channel may be a communication bus such as an ONFI bus, though examples are not so limited. The data can be sent to the memory device during training of the channel to a calculated target channel BER.

At operation 473 of the system 410, the PHY I/O can be configured to receive the data from the memory device via the channel. The data can be sent to the PHY I/O from the memory device during training of the channel to a calculated target channel BER. The data transmitted from the PHY I/O to the memory device and received by the PHY I/O from the memory device can be test data sent in a loop between the PHY I/O and the memory device. For example, the PHY I/O may be coupled to training logic (e.g., the training logic 222 of FIG. 2) and the memory device may include loopback logic (e.g., the loopback 233 of FIG. 2). As such, the data may be transferred a first time across the channel from the PHY I/O to the memory device and transferred a second time across the channel from the memory device to the PHY I/O in a loop without the test data being written to or read from the memory device.

At operation 475 of the system 410, the processor coupled to the PHY I/O can be configured to determine the actual channel BER. The actual channel BER can be determined based on errors encountered by the test data while being sent from the PHY I/O to the memory device via the channel and being received by the PHY I/O from the memory device via the channel. The processor, utilizing the training logic, can determine the number of errors encountered by the test data as the test data traverses the channel. Accordingly, the test data travels across the channel twice. As such, the number of errors can be divided in half to determine the actual channel BER.

At operation 477 of the system 410, the processor coupled to the PHY I/O can be configured to determine a temperature associated with the channel. The temperature may be measured by the temperature sensor 229 of FIG. 2. The processor may be further configured to monitor the temperature detected by the temperature sensor. In some embodiments, the processor may be further configured to compare the determined temperature associated with the channel with previously stored temperatures, as further described herein. The processor can be further configured to determine a voltage value (i.e., voltage output) of a voltage regulator. The voltage value can be associated with the channel. The voltage value of the channel can, therefore, be set and regulated by the voltage regulator 227 of FIG. 2, as further described herein. Regulating the voltage value can alter the quantity of errors encountered by the data while being transferred over the channel.

The processor can be further configured to store the temperature, the actual channel BER, the determined voltage value, and a current date or current date and time. The temperature, the actual channel BER, the determined voltage value, and the current date or current date and time can be stored in the data structure 226 of FIG. 2. For example, the processor can be configured to, in response to the temperature associated with the channel not being previously stored in the data structure, associate the temperature with the actual channel BER and the determined voltage value and store the associated temperature, the actual channel BER, the voltage value, and the current date or current date and time in the data structure.

In some embodiments, the processor can be configured to, in response to the temperature associated with the channel being previously stored in the data structure, determine the date or date and time in which the temperature was stored in the data structure. The processor can be further configured to, in response to the date or date and time in which the temperature was stored in the data structure exceeding a threshold period of time, retrain the channel. In response to retraining the channel, the processor can be configured to associate the temperature with the actual channel BER and the determined voltage value and store the associated temperature, the actual channel BER, the voltage value, and the current date or current date and time in the data structure.

As previously described, changes in temperature may result in a variation in quantity of errors encountered over the channel and/or from the memory device of the system 410. For example, a significant change in temperature (i.e., a threshold value of 5 degrees, 10 degrees, 15 degrees, etc.) may cause an increase or decrease in the quantity of errors in the system 410. In some embodiments, the processor can be configured to monitor the temperature associated with the channel via the temperature sensor. In response to an increase or a decrease in the temperature exceeding the threshold value, the processor can further be configured to control regulation of the voltage value associated with the channel. For example, in response to the increase or decrease in the temperature exceeding the threshold value, the processor can be configured to query the data structure to determine whether the increase or decrease in temperature is stored in the data structure and the date or date and time in which the increased or decreased temperature was stored in the data structure. In response to determining that the increased or decreased temperature is not stored in the data structure or the date or date and time in which the increased or decreased temperature was stored exceeds the threshold period of time, the processor can be configured to retrain the channel, as previously detailed.

In some embodiments, in response to determining that the increased or decreased temperature is stored in the data structure and the date does not exceed the threshold period of time, the processor can be configured to control regulation of the voltage value in accordance with the voltage value in the data structure that is associated to the increased or decreased temperature. For example, the processor can be configured to control the voltage regulator causing the voltage value to increase in response to the actual channel BER associated with the increased or decreased temperature in the data structure being higher than an upper value of a threshold range from the calculated target channel BER. Further, the processor can be configured to control the voltage regulator causing the voltage value to decrease in response to the actual channel BER associated with the increased or decreased temperature in the data structure being less than a lower value of the threshold range from the calculated target channel BER. Further, the processor can be configured to control the voltage regulator causing the voltage value to be maintained in response to the actual channel BER associated with the increased or decreased temperature in the data structure being within the threshold range of the calculated target channel BER. As such, in some embodiments, since the temperature was previously stored in the data structure within the threshold period of time the voltage can be regulated without retraining the channel, minimizing the workload of the system 410, saving time, and increasing efficiency. At operation 479 of the system 410, the processor coupled to the PHY I/O can be configured to control regulation of the voltage value associated with the channel. In some embodiments, the processor coupled to the PHY I/O can be configured to calculate a target channel BER. The processor can be further configured to compare the calculated target channel BER to the actual channel BER. Based on the comparison between the calculated target channel BER and the actual channel BER, the processor can be configured to control regulation of the voltage value associated with the channel. For example, the processor can be configured to control regulation of the voltage value to minimize a difference between the actual channel BER and the calculated target channel BER. As an example, the voltage value may be increased or decreased to change the actual BER encountered over the channel 424. The processor can control regulation of the voltage value by controlling the voltage output from the voltage regulator, where the voltage output from the voltage regulator is the voltage value associated with the channel.

Further, in some embodiments, the processor can be configured to calculate an actual BER of the memory device 130. The processor can be configured to calculate the actual memory device BER based on a difference between the actual total BER and the actual channel BER. For example, the PHY I/O can be configured to transmit data to the memory device and receive a bit string comprising data read from the memory device. The PHY I/O can receive the bit string including the data read from the memory device via the channel. The bit string can comprise the data previously transmitted to the memory device from the PHY I/O and any errors introduced to the data by the memory device and encountered over the channel. The processor, utilizing a decoder (e.g., the decoder 225 of FIG. 2) to decode a codeword received in the bit string from the memory device, can be further configured to determine the actual total BER based on the number of errors corrected by the decoder that were induced by the memory device and encountered while being transferred over the channel. As such, the processor can be configured to determine the actual total BER. Accordingly, the actual memory device BER can be calculated based on a difference between the actual total BER and the actual channel BER.

The processor can be further configured to calculate a target channel BER based on a difference between the target total BER and the actual memory device BER. The processor may further be configured to associate the calculated target channel BER and a current date or current date and time to the target total BER and the actual channel BER (and/or to the actual memory device BER) and store the association in a data structure for future reference. As previously described, the processor can be configured to compare the actual channel BER to the calculated target channel BER and, based on the comparison, control regulation of the voltage value associated with the channel. Accordingly, the processor can regulate the voltage value by controlling the voltage output from the voltage regulator, where the voltage output from the voltage regulator is the voltage value associated with the channel.

Figure 5:
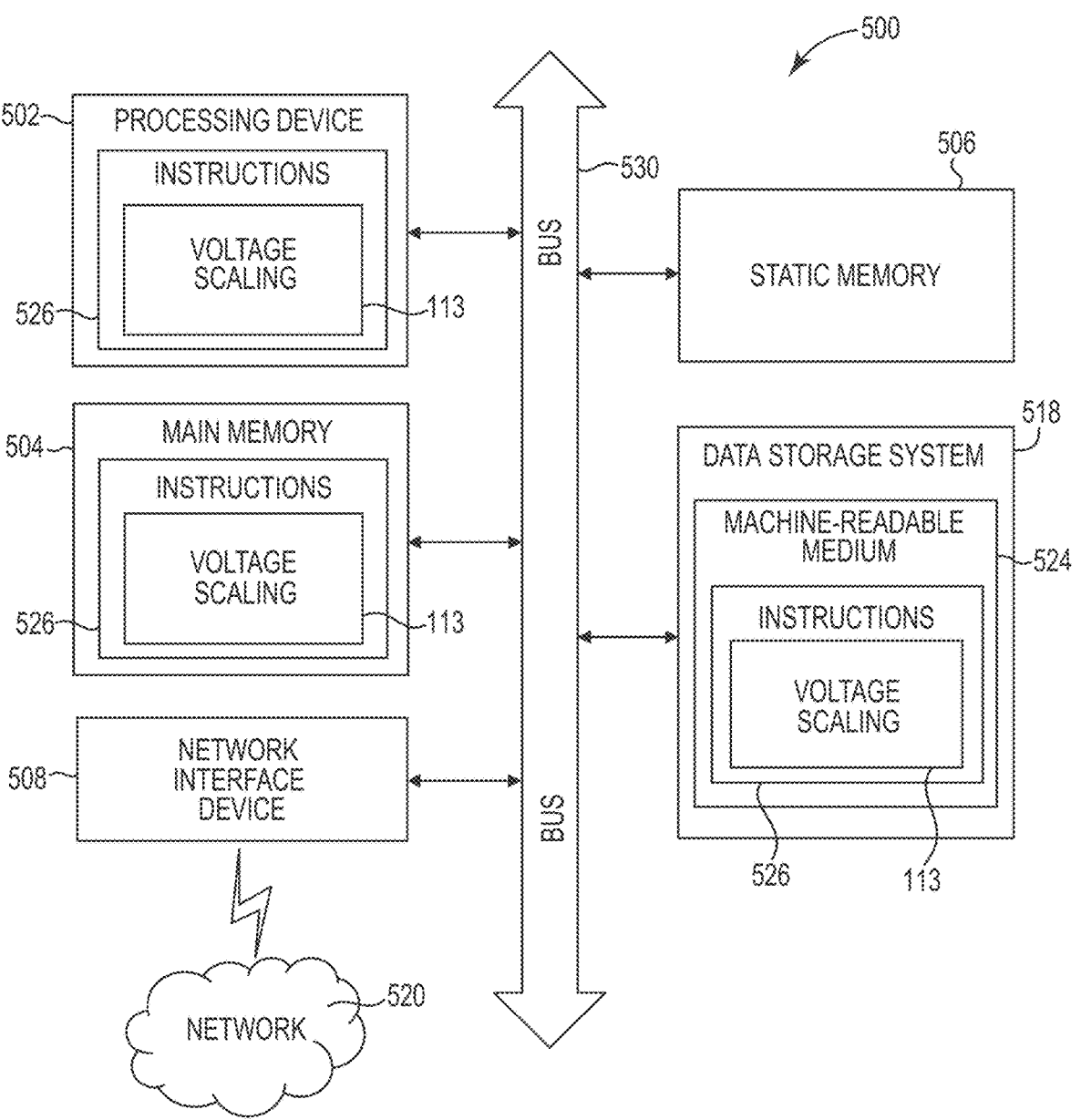
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the voltage scaling circuitry 113 and the PHY I/O 123 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device 502 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to voltage scaling circuitry 113 and a PHY I/O (e.g., the voltage scaling circuitry 113 and the PHY I/O 123 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read-only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   determining a target total bit-error-rate (BER);
   calculating a target channel BER, based on the target total BER; and
   training a channel to the calculated target channel BER by:
       transmitting data, over the channel in a loop, from a physical input/output (PHY I/O) to a memory device;
       transmitting the data, over the channel in the loop, from the memory device to the PHY I/O, wherein the data is looped from the PHY I/O to the memory device and back to the PHY I/O;
       determining an actual channel BER based on the data transmitted to the memory device and the data received from the memory device;

comparing the actual channel BER to the calculated target channel BER; and
regulating a voltage value, associated with the channel, based on the comparison between the actual channel BER and the calculated target channel BER.

2. The method of claim 1, wherein calculating the target channel BER comprises:
   determining an actual total BER;
   calculating an actual memory device BER based on a difference between the actual total BER and the actual channel BER; and
   calculating the target channel BER based on a difference between the target total BER and the actual memory device BER.

3. The method of claim 1, further comprising:
   determining a temperature associated with the channel;
   determining the voltage value associated with the channel;
   associating the channel temperature and the channel voltage value with the actual channel BER; and
   storing the actual channel BER and the channel temperature and the channel voltage value associated with the actual channel BER.

4. The method of claim 1, further comprising:
   monitoring a temperature value associated with the channel; and
   in response to a change in the monitored temperature value exceeding a threshold value, querying a data structure for information associated with the monitored temperature value.

5. The method of claim 4, further comprising:
   in response to information associated with the monitored temperature value not being in the data structure, retraining the channel to the calculated target channel BER.

6. The method of claim 4, further comprising:
   in response to the information associated with the monitored temperature value being in the data structure, determining a date that the information was stored in the data structure; and
   in response to the date exceeding a threshold period of time, retraining the channel to the calculated target channel BER.

7. The method of claim 1, wherein regulating the voltage value comprises:
   calculating a difference between the actual channel BER and the calculated target channel BER; and
   regulating the voltage value to reduce the difference between the actual channel BER and the calculated target channel BER by:
       increasing the voltage value in response to the actual channel BER being higher than an upper value of a threshold range from the calculated target channel BER;
       decreasing the voltage value in response to the actual channel BER being less than a lower value of the threshold range from the calculated target channel BER; and
       maintaining the voltage value in response to the actual channel BER being within the threshold range from the calculated target channel BER.

8. An apparatus, comprising:
   a physical input/output (PHY I/O), wherein the PHY I/O is configured to:
       send data to a memory device over a channel; and
       receive the data from the memory device over the channel; and a processor coupled to the PHY I/O, wherein the processor is configured to:

determine an actual channel bit-error-rate (BER) based on the data sent to the memory device and the data received from the memory device; and control regulation of a voltage value in response to the determined actual channel BER.

9. The apparatus of claim 8, wherein the processor is further configured to:

calculate a target channel BER; and control regulation of the voltage value based on a difference between the actual channel BER and the calculated target channel BER.

10. The apparatus of claim 9, wherein the processor is further configured to:

calculate an actual BER of the memory device;

determine a target total BER; and calculate the target channel BER based on a difference between the target total BER and the actual memory device BER.

11. The apparatus of claim 8, wherein the processor is further configured to:

determine a temperature and a voltage value associated with the channel;

associate the temperature and the voltage value with the actual channel BER; and store the temperature, actual channel BER, and the voltage value.

12. The apparatus of claim 8, wherein the processor is further configured to:

determine a temperature associated with the channel;

compare the temperature associated with the channel to stored temperatures; and in response to the temperature associated with the channel not matching a stored temperature:

determine the voltage value associated with the channel;

associate the temperature and the voltage value with the actual channel BER; and store the temperature, the actual channel BER, and the voltage value.

13. The apparatus of claim 8, wherein the processor is further configured to:

determine a temperature associated with the channel and compare the temperature associated with the channel to temperatures stored; and in response to the temperature matching a stored temperature:

determine a date and a time that the stored temperature was stored;

in response to the date and time exceeding a threshold period of time:

determine the voltage value; and associate the temperature and the voltage value with the actual channel BER; and store the temperature, the actual channel BER, the voltage value, and a current date and time.

14. A system comprising:

a memory device;

a physical input/output (PHY I/O), wherein the PHY I/O is configured to:

transmit test data to the memory device via a channel; and receive the test data from the memory device via the channel; and a processor coupled to the PHY I/O, wherein the processor is configured to:

determine an actual bit-error-rate (BER) associated with the channel based on the transmitted test data and the received test data;

determine a temperature and a voltage value associated with the channel; and control regulation of the voltage value associated with the channel based on the actual channel BER, the channel temperature, and the channel voltage value.

15. The system of claim 14, wherein the processor is further configured to:

calculate a target channel BER;

calculate a difference between the actual channel BER and the calculated target channel BER; and control regulation of the voltage value based on the difference between the actual channel BER and the calculated target channel BER.

16. The system of claim 14, wherein in response to determination of the temperature associated with the channel, the processor is further configured to:

compare the determined temperature to temperatures stored in a data structure, and in response to the temperature not being stored in the data structure:

associate the temperature with the actual channel BER and the voltage value; and store the associated temperature, the actual channel BER, the voltage value, and a current date in the data structure.

17. The system of claim 14, wherein in response to determining the temperature associated with the channel, the processor is further configured to:

compare the determined temperature to stored temperatures, and in response to the temperature matching a stored temperature in a data structure:

determine a date that the temperature was stored in the data structure; and in response to the date exceeding a threshold period of time:

associate the temperature with the actual channel BER and the voltage value; and store the associated temperature, the actual channel BER, the voltage value, and a current date in the data structure.

18. The system of claim 14, wherein the processor is further configured to monitor the temperature associated with the channel and in response to an increase or a decrease in the temperature exceeding a threshold value, regulate the voltage value associated with the channel.

19. The system of claim 18, wherein the processor is further configured to:

determine whether the increased or decreased temperature is stored in a data structure and a date the increased or decreased temperature was stored in the data structure; and in response to the increased or decreased temperature being stored in the data structure and the date not exceeding a threshold period of time, control regulation of the voltage value in response to the actual channel BER associated with the increased or decreased temperature being:

higher than an upper value of a threshold range from a calculated target channel BER by increasing the voltage value; and less than a lower value of the threshold range from the calculated target channel BER by decreasing the voltage value.

20. The system of claim 18, wherein the processor is further configured to:

determine whether the increased or decreased temperature is stored in a data structure and a date the increased or decreased temperature was stored in the data structure; and in response to the increased or decreased temperature being stored in the data structure and the date not exceeding a threshold period of time, control regulation of the voltage value in response to the actual channel BER associated with the increased or decreased temperature being within a threshold range of a calculated target channel BER by maintaining the voltage value.

\* \* \* \* \*